(12) United States Patent
Brask et al.

(10) Patent No.: US 7,579,280 B2
(45) Date of Patent: Aug. 25, 2009

(54) METHOD OF PATTERNING A FILM

(75) Inventors: Justin K. Brask, Portland, OR (US);
Brian S. Doyle, Portland, OR (US);
Uday Shah, Portland, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 225 days.

(21) Appl. No.: 10/859,328

(22) Filed: Jun. 1, 2004

(65) Prior Publication Data

US 2005/0266692 A1    Dec. 1, 2005

(51) Int. Cl.
*H01L 21/311* (2006.01)

(52) U.S. Cl. .................. 438/696; 438/695; 438/745; 257/E23.133; 257/E21.017

(58) Field of Classification Search .................. 438/595, 438/694, 696, 723, 724, FOR. 388, 637, 638, 438/695, 745, 906; 257/E21.579, E23.133, 257/E21.017
See application file for complete search history.

(56) References Cited

U.S. PATENT DOCUMENTS

| | | | |
|---|---|---|---|
| 4,231,149 A | 11/1980 | Chapman et al. | |
| 4,487,652 A | 12/1984 | Almgren | |
| 4,818,715 A | 4/1989 | Chao | |
| 4,905,063 A | 2/1990 | Beltram et al. | |
| 4,906,589 A * | 3/1990 | Chao | 438/305 |
| 4,907,048 A | 3/1990 | Huang | |
| 4,994,873 A | 2/1991 | Madan | |
| 4,996,574 A | 2/1991 | Shirasaki et al. | |
| 5,023,203 A * | 6/1991 | Choi | 438/696 |
| 5,124,777 A | 6/1992 | Lee et al. | |
| 5,179,037 A | 1/1993 | Seabaugh | |
| 5,216,271 A | 6/1993 | Takagi et al. | |
| 5,338,959 A | 8/1994 | Kim et al. | |
| 5,346,839 A | 9/1994 | Sundaresan | |
| 5,391,506 A | 2/1995 | Tada et al. | |
| 5,466,621 A | 11/1995 | Hisamoto et al. | |
| 5,521,859 A | 5/1996 | Ema et al. | |
| 5,543,351 A | 8/1996 | Hirai et al. | |
| 5,545,586 A | 8/1996 | Koh | |

(Continued)

FOREIGN PATENT DOCUMENTS

DE    102 03 998 A1    8/2003

(Continued)

OTHER PUBLICATIONS

International Search Report PCT/US03/26242.

(Continued)

*Primary Examiner*—Michelle Estrada
(74) *Attorney, Agent, or Firm*—Blakely, Sokoloff, Taylor & Zafman LLP (57) ABSTRACT

A method of patterning a thin film. The method includes forming a mask on a film to be patterned. The film is then etched in alignment with the mask to form a patterned film having a pair of laterally opposite sidewalls. A protective layer is formed on the pair of laterally opposite sidewalls. Next, the mask is removed from above the patterned film. After removing the mask from the patterned film, the protective layer is removed from the sidewalls.

32 Claims, 5 Drawing Sheets

U.S. PATENT DOCUMENTS

| | | | |
|---|---|---|---|
| 5,563,077 A | 10/1996 | Ha et al. |
| 5,578,513 A | 11/1996 | Maegawa |
| 5,658,806 A | 8/1997 | Lin et al. |
| 5,698,869 A | 12/1997 | Yoshimi et al. |
| 5,701,016 A | 12/1997 | Burroughs et al. |
| 5,716,879 A | 2/1998 | Choi et al. |
| 5,739,544 A | 4/1998 | Yuki et al. |
| 5,760,442 A | 6/1998 | Shigyo et al. |
| 5,770,513 A | 6/1998 | Okaniwa |
| 5,773,331 A | 6/1998 | Solomon et al. |
| 5,804,848 A | 9/1998 | Mukai |
| 5,814,895 A | 9/1998 | Hirayama |
| 5,821,629 A | 10/1998 | Wen et al. |
| 5,827,769 A | 10/1998 | Aminzadeh et al. |
| 5,844,278 A | 12/1998 | Mizuno et al. |
| 5,880,015 A | 3/1999 | Hata |
| 5,888,309 A * | 3/1999 | Yu .................... 134/1.2 |
| 5,889,304 A | 3/1999 | Watanabe et al. |
| 5,899,710 A | 5/1999 | Mukai |
| 5,905,285 A | 5/1999 | Gardner et al. |
| 5,908,313 A | 6/1999 | Chau et al. |
| 5,952,701 A | 9/1999 | Bulucea et al. |
| 6,013,926 A | 1/2000 | Oku et al. |
| 6,018,176 A | 1/2000 | Lim |
| 6,051,452 A | 4/2000 | Shigyo et al. |
| 6,054,355 A | 4/2000 | Inumiya et al. |
| 6,066,869 A | 5/2000 | Noble et al. |
| 6,087,208 A | 7/2000 | Krivokapic et al. |
| 6,093,621 A | 7/2000 | Tseng |
| 6,117,741 A | 9/2000 | Chatterjee et al. |
| 6,153,485 A | 11/2000 | Pey et al. |
| 6,163,053 A | 12/2000 | Kawashima |
| 6,165,880 A | 12/2000 | Yaung et al. |
| 6,218,309 B1 | 4/2001 | Miller et al. |
| 6,251,729 B1 | 6/2001 | Montree et al. |
| 6,251,763 B1 | 6/2001 | Inumiya et al. |
| 6,252,284 B1 | 6/2001 | Muller et al. |
| 6,261,921 B1 | 7/2001 | Yen et al. |
| 6,294,416 B1 | 9/2001 | Wu |
| 6,335,251 B2 | 1/2002 | Miyano et al. |
| 6,358,800 B1 | 3/2002 | Tseng |
| 6,359,311 B1 | 3/2002 | Colinge et al. |
| 6,376,317 B1 | 4/2002 | Forbes et al. |
| 6,391,782 B1 | 5/2002 | Yu |
| 6,396,108 B1 | 5/2002 | Krivokapic et al. |
| 6,407,442 B2 | 6/2002 | Inoue et al. |
| 6,413,802 B1 | 7/2002 | Hu et al. |
| 6,413,877 B1 * | 7/2002 | Annapragada ............ 438/723 |
| 6,424,015 B1 | 7/2002 | Ishibashi et al. |
| 6,437,550 B2 | 8/2002 | Andoh et al. |
| 6,459,123 B1 | 10/2002 | Enders et al. |
| 6,472,258 B1 | 10/2002 | Adkisson et al. |
| 6,475,869 B1 | 11/2002 | Yu |
| 6,475,890 B1 | 11/2002 | Yu |
| 6,483,156 B1 | 11/2002 | Adkisson et al. |
| 6,498,096 B2 | 12/2002 | Bruce et al. |
| 6,506,692 B2 | 1/2003 | Andideh |
| 6,525,403 B2 | 2/2003 | Inaba et al. |
| 6,526,996 B1 * | 3/2003 | Chang et al. ............ 134/1.3 |
| 6,534,807 B2 | 3/2003 | Mandelman et al. |
| 6,537,885 B1 | 3/2003 | Kang et al. |
| 6,537,901 B2 | 3/2003 | Cha et al. |
| 6,541,829 B2 | 4/2003 | Nishinohara et al. |
| 6,562,665 B1 | 5/2003 | Yu |
| 6,562,687 B1 | 5/2003 | Deleonibus et al. |
| 6,583,469 B1 | 6/2003 | Fried et al. |
| 6,605,498 B1 | 8/2003 | Murthy et al. |
| 6,610,576 B2 | 8/2003 | Nowak |
| 6,611,029 B1 | 8/2003 | Ahmed et al. |
| 6,630,388 B2 | 10/2003 | Sekigawa et al. |
| 6,635,909 B2 | 10/2003 | Clark et al. |
| 6,642,090 B1 | 11/2003 | Fried et al. |
| 6,645,797 B1 | 11/2003 | Buynoski et al. |
| 6,645,826 B2 | 11/2003 | Yamazaki et al. |
| 6,645,861 B2 | 11/2003 | Cabral et al. |
| 6,656,853 B2 | 12/2003 | Ito |
| 6,657,259 B2 | 12/2003 | Fried et al. |
| 6,660,598 B2 | 12/2003 | Hanafi et al. |
| 6,664,160 B2 | 12/2003 | Park et al. |
| 6,680,240 B1 | 1/2004 | Maszara |
| 6,689,650 B2 | 2/2004 | Gambino et al. |
| 6,693,324 B2 | 2/2004 | Maegawa et al. |
| 6,696,366 B1 | 2/2004 | Morey et al. |
| 6,706,571 B1 | 3/2004 | Yu et al. |
| 6,709,982 B1 | 3/2004 | Buynoski et al. |
| 6,713,396 B2 * | 3/2004 | Anthony .................... 438/694 |
| 6,716,684 B1 | 4/2004 | Krivokapic et al. |
| 6,716,690 B1 | 4/2004 | Wang et al. |
| 6,730,964 B2 | 5/2004 | Horiuchi |
| 6,744,103 B2 | 6/2004 | Snyder |
| 6,756,657 B1 | 6/2004 | Zhang et al. |
| 6,764,884 B1 | 7/2004 | Yu et al. |
| 6,770,516 B2 | 8/2004 | Wu et al. |
| 6,774,390 B2 | 8/2004 | Sugiyama et al. |
| 6,787,402 B1 | 9/2004 | Yu |
| 6,787,439 B2 | 9/2004 | Ahmed et al. |
| 6,787,845 B2 | 9/2004 | Deleonibus |
| 6,787,854 B1 | 9/2004 | Yang et al. |
| 6,790,733 B1 * | 9/2004 | Natzle et al. ................. 438/300 |
| 6,794,313 B1 * | 9/2004 | Chang ........................ 438/770 |
| 6,794,718 B2 | 9/2004 | Nowak et al. |
| 6,798,000 B2 | 9/2004 | Luyken et al. |
| 6,800,885 B1 | 10/2004 | An et al. |
| 6,800,910 B2 | 10/2004 | Lin et al. |
| 6,815,277 B2 | 11/2004 | Fried et al. |
| 6,821,834 B2 | 11/2004 | Ando |
| 6,825,506 B2 | 11/2004 | Chau et al. |
| 6,833,588 B2 | 12/2004 | Yu et al. |
| 6,835,614 B2 | 12/2004 | Hanafi et al. |
| 6,835,618 B1 | 12/2004 | Dakshina-Murthy et al. |
| 6,838,322 B2 | 1/2005 | Pham et al. |
| 6,844,238 B2 | 1/2005 | Yeo et al. |
| 6,849,884 B2 | 2/2005 | Clark et al. |
| 6,852,559 B2 | 2/2005 | Kwak et al. |
| 6,855,606 B2 | 2/2005 | Chen et al. |
| 6,855,990 B2 | 2/2005 | Yeo et al. |
| 6,858,478 B2 | 2/2005 | Chau et al. |
| 6,867,433 B2 | 3/2005 | Yeo et al. |
| 6,867,460 B1 | 3/2005 | Anderson et al. |
| 6,869,868 B2 | 3/2005 | Chiu et al. |
| 6,884,154 B2 | 4/2005 | Mizushima et al. |
| 6,885,055 B2 | 4/2005 | Lee |
| 6,897,527 B2 | 5/2005 | Dakshina-Murthy et al. |
| 6,921,691 B1 | 7/2005 | Li et al. |
| 6,921,702 B2 | 7/2005 | Ahn et al. |
| 6,921,963 B2 | 7/2005 | Krivokapic et al. |
| 6,921,982 B2 | 7/2005 | Joshi et al. |
| 6,924,190 B2 | 8/2005 | Dennison |
| 6,960,517 B2 | 11/2005 | Rios et al. |
| 6,967,351 B2 | 11/2005 | Fried et al. |
| 6,974,738 B2 | 12/2005 | Hareland |
| 7,018,551 B2 | 3/2006 | Beintner et al. |
| 7,045,401 B2 | 5/2006 | Lee et al. |
| 7,060,539 B2 | 6/2006 | Chidambarrao et al. |
| 7,061,055 B2 | 6/2006 | Sekigawa et al. |
| 7,071,064 B2 | 7/2006 | Doyle et al. |
| 7,074,623 B2 | 7/2006 | Lochtefeld et al. |
| 7,105,891 B2 | 9/2006 | Visokay et al. |
| 7,112,478 B2 | 9/2006 | Grupp et al. |
| 7,122,463 B2 | 10/2006 | Ohuchi |
| 7,141,856 B2 | 11/2006 | Lee et al. |
| 7,154,118 B2 | 12/2006 | Lindert |
| 7,163,851 B2 | 1/2007 | Adadeer et al. |
| 7,183,137 B2 | 2/2007 | Lee et al. |

| | | |
|---|---|---|
| 7,187,043 B2 | 3/2007 | Arai et al. |
| 7,238,564 B2 | 7/2007 | Ko et al. |
| 7,241,653 B2 | 7/2007 | Hareland et al. |
| 7,250,645 B1 | 7/2007 | Wang et al. |
| 7,358,121 B2 | 4/2008 | Chau et al. |
| 2001/0040907 A1 | 11/2001 | Chakrabarti |
| 2002/0011612 A1 | 1/2002 | Hieda |
| 2002/0036290 A1 | 3/2002 | Inaba et al. |
| 2002/0081794 A1 | 6/2002 | Ito |
| 2002/0166838 A1 | 11/2002 | Nagarajan |
| 2002/0167007 A1 | 11/2002 | Yamazaki et al. |
| 2003/0057486 A1 | 3/2003 | Gambino et al. |
| 2003/0067017 A1 | 4/2003 | Leong et al. |
| 2003/0085194 A1 | 5/2003 | Hopkins, Jr. |
| 2003/0098488 A1 | 5/2003 | O'Keeffe et al. |
| 2003/0102497 A1 | 6/2003 | Fried et al. |
| 2003/0111686 A1 | 6/2003 | Nowak |
| 2003/0122186 A1 | 7/2003 | Sekigawa et al. |
| 2003/0143791 A1 | 7/2003 | Cheong et al. |
| 2003/0151077 A1 | 8/2003 | Mathew et al. |
| 2003/0201458 A1 | 10/2003 | Clark et al. |
| 2003/0227036 A1 | 12/2003 | Sugiyama et al. |
| 2004/0029393 A1* | 2/2004 | Ying et al. .................. 438/745 |
| 2004/0031979 A1 | 2/2004 | Lochtefeld et al. |
| 2004/0033639 A1 | 2/2004 | Chinn et al. |
| 2004/0036118 A1 | 2/2004 | Adadeer et al. |
| 2004/0036126 A1 | 2/2004 | Chau et al. |
| 2004/0036127 A1 | 2/2004 | Chau et al. |
| 2004/0092062 A1 | 5/2004 | Ahmed et al. |
| 2004/0092067 A1 | 5/2004 | Hanafi et al. |
| 2004/0094807 A1 | 5/2004 | Chau et al. |
| 2004/0099966 A1 | 5/2004 | Chau et al. |
| 2004/0110097 A1 | 6/2004 | Ahmed et al. |
| 2004/0119100 A1 | 6/2004 | Nowak et al. |
| 2004/0126975 A1 | 7/2004 | Ahmed et al. |
| 2004/0132236 A1 | 7/2004 | Doris et al. |
| 2004/0145000 A1 | 7/2004 | An et al. |
| 2004/0166642 A1 | 8/2004 | Chen et al. |
| 2004/0180491 A1 | 9/2004 | Arai et al. |
| 2004/0191980 A1 | 9/2004 | Rios et al. |
| 2004/0195624 A1 | 10/2004 | Liu et al. |
| 2004/0198003 A1 | 10/2004 | Yeo et al. |
| 2004/0203254 A1 | 10/2004 | Conely et al. |
| 2004/0219780 A1* | 11/2004 | Ohuchi ......................... 438/637 |
| 2004/0227187 A1 | 11/2004 | Cheng et al. |
| 2004/0238887 A1 | 12/2004 | Nihey |
| 2004/0256647 A1 | 12/2004 | Lee et al. |
| 2004/0262683 A1 | 12/2004 | Bohr et al. |
| 2004/0262699 A1 | 12/2004 | Rios et al. |
| 2005/0019993 A1 | 1/2005 | Lee et al. |
| 2005/0035415 A1 | 2/2005 | Yeo et al. |
| 2005/0093067 A1 | 5/2005 | Yeo et al. |
| 2005/0093075 A1 | 5/2005 | Bentum et al. |
| 2005/0093154 A1 | 5/2005 | Kottantharayil et al. |
| 2005/0104055 A1 | 5/2005 | Kwak et al. |
| 2005/0118790 A1 | 6/2005 | Lee et al. |
| 2005/0127362 A1 | 6/2005 | Zhang et al. |
| 2005/0133866 A1 | 6/2005 | Chau et al. |
| 2005/0139860 A1 | 6/2005 | Snyder et al. |
| 2005/0145941 A1 | 7/2005 | Bedell et al. |
| 2005/0156171 A1 | 7/2005 | Brask et al. |
| 2005/0156202 A1 | 7/2005 | Rhee et al. |
| 2005/0156227 A1 | 7/2005 | Jeng |
| 2005/0167766 A1 | 8/2005 | Yagishita |
| 2005/0184316 A1 | 8/2005 | Kim et al. |
| 2005/0215022 A1 | 9/2005 | Adam et al. |
| 2005/0224797 A1 | 10/2005 | Ko et al. |
| 2005/0224800 A1 | 10/2005 | Lindert |
| 2005/0227498 A1 | 10/2005 | Furukawa et al. |
| 2005/0230763 A1 | 10/2005 | Huang et al. |
| 2005/0233156 A1 | 10/2005 | Senzaki et al. |
| 2005/0272192 A1 | 12/2005 | Oh et al. |
| 2005/0277294 A1 | 12/2005 | Schaeffer et al. |
| 2006/0014338 A1 | 1/2006 | Doris et al. |
| 2006/0040054 A1 | 2/2006 | Pearlstein et al. |
| 2006/0046521 A1 | 3/2006 | Vaartstra et al. |
| 2006/0154478 A1 | 7/2006 | Hsu et al. |
| 2007/0093010 A1 | 4/2007 | Mathew et al. |
| 2007/0108514 A1 | 5/2007 | Inoue et al. |

FOREIGN PATENT DOCUMENTS

| | | |
|---|---|---|
| EP | 0 623963 A1 | 11/1994 |
| EP | 1 202 335 A2 | 5/2002 |
| EP | 1 566 844 A2 | 8/2005 |
| GB | 2 156 149 | 10/1985 |
| JP | 59 145538 A | 8/1984 |
| JP | 02-303048 A | 12/1990 |
| JP | 06177089 | 6/1994 |
| JP | 06177089 A * | 6/1994 |
| JP | 06224440 A | 8/1994 |
| JP | 09162301 A | 6/1997 |
| JP | 200037842 A | 2/2000 |
| JP | 2003-298051 | 10/2003 |
| TW | 516232 | 1/2003 |
| TW | 548799 | 8/2003 |
| TW | 561530 | 11/2003 |
| TW | 200402872 A | 2/2004 |
| TW | 200405408 A | 4/2004 |
| WO | WO 02/43151 A1 | 5/2002 |
| WO | WO 2004/059726 A1 | 7/2004 |

OTHER PUBLICATIONS

International Search Report PCT/US03/39727.
International Search Report PCT/US03/40320.
International Search Report PCT/US2005/000947.
International Search Report PCT/US2005/010505.
International Search Report PCT/US2005/020339.
International Search Report PCT/US2005/033439, mailed Jan. 31, 2006 (7 pgs.).
International Search Report PCT/US2005/035380, mailed Feb. 13, 2006 (14 pgs.).
International Search Report PCT/US2005/037169, mailed Feb. 23, 2006 (11 pgs.).
Sung Min Kim, et al., A Novel Multi-channel Field Effect Transistor (McFET) on Bulk Si for High Performance Sub-80nm Application, IEDM 04-639, 2004 IEEE, pp. 27.4.1-27.4.4.
Yang-Kyu Choi, et al., "A Spacer Patterning Technology for Nanoscale CMOS" IEEE Transactions on Electron Devices, vol. 49, No. 3, Mar. 2002, pp. 436-441.
W. Xiong, et al., "Corner Effect in Multiple-Gate SOI MOSFETs" 2003 IEEE, pp. 111-113.
Weize Xiong, et al., "Improvement of FinFET Electrical Characteristics by Hydrogen Annealing" IEEE Electron Device Letters, vol. 25, No. 8, Aug. 2004, XP-001198998, pp. 541-543.
Fu-Liang Yang, et al., "5nm-Gate Nanowire FinFET" 2004 Symposium on VLSI Technology Digest of Technical Papers, 2004 IEEE, pp. 196-197.
T. M. Mayer, et al., "Chemical Vapor Deposition of Fluoroalkylsilane Monolayer Films for Adhesion Control in Microelectromechanical Systems" 2000 American Vacuum Society B 18(5), Sep.-Oct. 2000, pp. 2433-2440.
Jing Guo et al. "Performance Projections for Ballistic Carbon Nanotube Field-Effect Transistors" Applied Physics Letters, vol. 80, No. 17, pp. 3192-2194 (Apr. 29, 2002).
Ali Javey et al., "High-K Dielectrics for Advanced Carbon-Nanotube Transistors and Logic Gates", Advance Online Publication, Published online, pp. 1-6 (Nov. 17, 2002).
Richard Martel et al., "Carbon Nanotube Field Effect Transistors for Logic Applications" IBM, T.J. Watson Research Center, 2001 IEEE, IEDM 01, pp. 159-162.
David M. Fried et al., "Improved Independent Gate N-Type FinFET Fabrication and Characterization", IEEE Electron Device Letters, vol. 24, No. 9, Sep. 2003, pp. 592-594.

David M. Fried et al., "Improved Independent Gate P-Type Independent-Gate FinFETs", IEEE Electron Device Letters, vol. 25, No. 4, Apr. 2004, pp. 199-201.

Charles Kuo et al. "A Capacitorless Double Gate DRAM Technology for Sub-100-nm Embedded and Stand-Alone Memory Applications, IEEE Transactions on Electron Devices", vol. 50, No. 12, Dec. 2003, pp. 2408-2416.

Charles Kuo et al., "A Capacitorless Double-Gate DRAM Cell Design for High Density Applications", 2002 IEEE International Electron Devices Meeting Technical Digest, Dec. 2002, pp. 843-846.

Takashi Ohsawa et al., "Memory Design Using a One-Transistor Gain Cell on SOI", IEEE Journal of Solid-State Circuits, vol. 37, No. 11, Nov. 2002, pp. 1510-1522.

T. Tanaka et al., Scalability Study on a Capacitorless 1T-DRAM: From Single-Gate PD-SOI to Double-Gate FinDram, 2004 IEEE International Electron Devices Meeting Technical Digest, Dec. 2004, 4 pages.

V. Subramanian et al. "A Bulk Si-Compatible Ultrathin-Body SOI Technology for Sub-100nm MOSFETS", Proceedings of the 57th Annual Device Reach Conference, pp. 28-29 (1999).

Hisamoto et al. "A Folded-Channel MOSFET for Deepsub-tenth Micron Era", 1998 IEEE International Electron Device Meeting Technical Digest, pp. 1032-1034 (1998).

Huang et al., "Sub 50nm FinFet: PMOS", 1999 IEEE International Electron Device Meeting Technical Digets, pp. 67-70 (1999).

Auth et al., "Vertical, Fully-Depleted, Surroundings Gate MOSFETS on Sub 0.1um Thick Silicon Pillars", 1996 54th Annual Device Reseach Conference Digest, pp. 108-109 (1996).

Hisamoto et al., "A Fully Depleted Lean-Channel Transistor (DELTA)-A Novel Vertical Ultrathin SOI Mosfet", IEEE Electron Device Letters, Vo. 11(1), pp. 36-38 (1990).

Jong-Tae Park et al., "Pi-Gate SOI MOSFET" IEEE Electron Device Letters, vol. 22, No. 8, Aug. 2001, pp. 405-406.

Digh Hisamoto, et al., "FinFet-A Self Aligned Double-Gate MOSFET Scalable to 20nm", IEEE Transactions on Electron Devices, vol. 47, No. 12, Dec. 2000, pp. 2320-2325.

T. Park et al., "Fabrication of Body-Tied FinFETs (Omega MOSFETS) Using Bulk Si Wafers", 2003 Symposia on VLSI Technology Digest of Technical Papers, Jun. 2003, pp. 135-136.

A. Burenkov et al., "Corner Effect in Double and Triple Gate FinFets", IEEE 2003, pp. 135-138.

S.T. Chang et al., "3-D Simulation of Strained Si/SiGe Heterojunction FinFETs", pp. 176-177.

International Search Report PCT/US2004/032442.

International Search Report and Written Opinion PCT/US2006/000378.

International Search Report PCT/US2006/024516.

International Search Report PCT/US2006/037643.

B. Jin et al., "Mobility Enhancement in Compressively Strained SiGe Surface Channel PMOS Transistors with Hf02/TiN Gate Stack", Proceedings of the First Joint International Symposium, 206th Meeting of Electrochemical Society, Oct. 2004, pp. 111-122.

R. Chau, "Advanced Metal Gate/High-K Dielectric Stacks for High-Performance CMOS Transistors", Proceedings of AVS 5th International Conference of Microelectronics and Interfaces, Mar. 2004, (3 pgs.).

T. Ludwig et al., "FinFET Technology for Future Microprocessors" 2003 IEEE, pp. 33-34.

Peter A. Stolk et al. "Modeling Statistical Dopant Fluctuations in MOS Transistors", 1998 IEEE, IEEE Transactions on Electron Devices, vol. 45, No. 9, Sep. 1987, pp. 1960-1971.

Evert Seevinck et al., "Static-Noise Margin Analysis of MOS SRAM Cells" 1987 IEEE, IEEE Journals of Solid-State Circuits, vol. SC-22, No. 5, Oct. 1987.

Yang-Kyu Choi et al. "Sub-20nm CMOS FinFET Technologies", IEEE 2001, IEDM 01-421 to 01-424.

M. Ieong et al. "Three Dimensional CMOS Devices and Integrated Circuits", IEEE 2003, CICC, San Jose, CA, Sep. 21-24, 2003, pp. 207-214.

E.J. Nowak et al., "Scaling Beyond the 65nm Node with FinFET-DGCMOS", IEEE 2003, CICC, San Jose, CA, Sep. 21-24, 2003, pp. 339-342.

E.C. Jones, "Doping Challenges in Exploratory Devices for High Performance Logic", 14th International Conference, Piscataway, NJ, Sep. 22-27, 2002, pp. 1-6.

T. Park et al. "PMOS Body-Tied FinFET (Omega MOSFET) Characteristics", Device Research Conference, Piscataway, NJ, Jun. 23-25, 2003, IEEE, pp. 33-34.

E.J. Nowak et al., "A Functional FinFET-DGCMOS SRAM Cell", International Electron Devices Meeting 2002, San Francisco, CA, Dec. 8-11, 2002, pp. 411-414.

Jae-Hyoun Park, "Quantum-wired MOSFET Photodetector Fabricated by Conventional Photolithography on SOI Substrate", Nanotechnology, 2004, 4th IEEE Conference on Munich, Germany, Aug. 16-19, 2004, Piscataway, NJ, pp. 425-427, XP010767302.

L. Chang et al. "CMOS Circuit Performance Enhancement by Surface Orientation Optimization" IEEE Transactions on Electron Devices, IEEE Service Center, Piscataway, NJ vol. 51, No. 10, Oct. 2004, pp. 1621-1627 XP001211140.

M. Stadele et al., "A Comprehensive Study of Corner Effects in Tri-gate Transistors", IEEE 2004, pp. 165-168.

Ali Javey et al., "Ballistic Carbon Nanotube Field-Effect Transistors", Nature, vol. 424, Aug. 7, 2003, pp. 654-657.

R. Chau et al., Advanced Depleted-Substrate Transistors: Single-Gate, Double-Gate and Tri-gate (Invited Paper), Components Research, Logic Technology Development, Intel Corporation, HIllsboro OR, 2 pages.

* cited by examiner

METHOD OF PATTERNING A FILM

BACKGROUND OF THE INVENTION

1. Field of the Invention

The present invention relates to the field of semiconductor manufacturing and more particularly to a method of patterning a thin film.

2. Discussion of Related Art

Figure 1A:
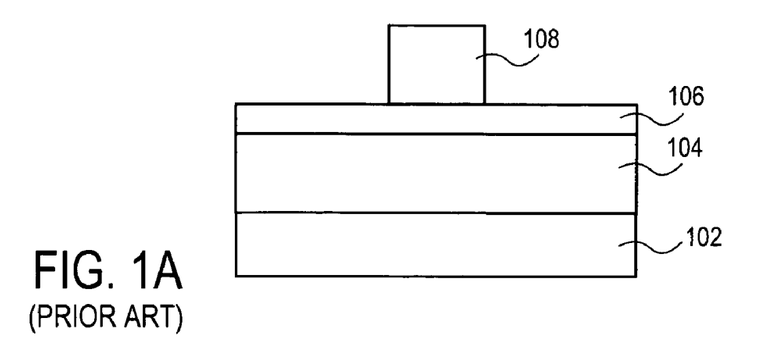
FIG. 1A-1D is an illustration of a cross-sectional view of a conventional method of patterning a film utilizing a hard mask.
Figure 1B:
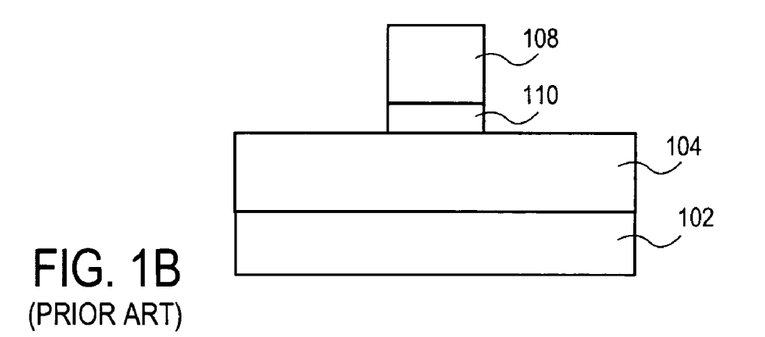
Figure 1C:
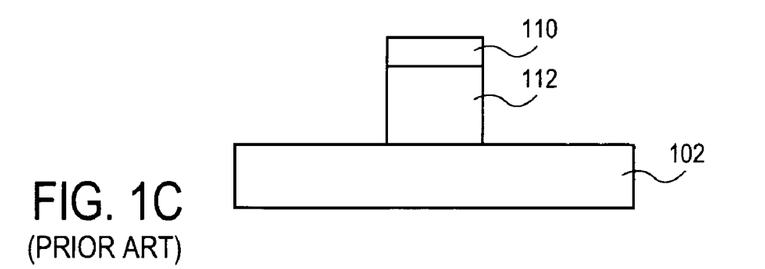
Figure 1D:
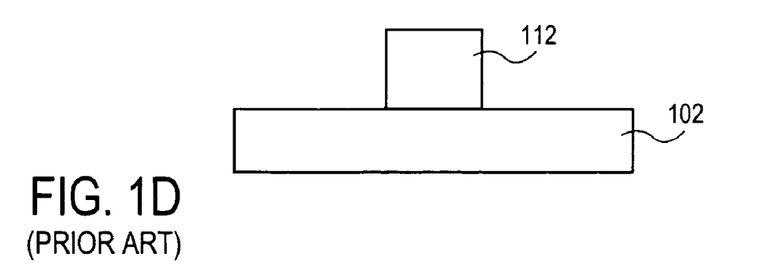

Patterned thin films are used in many applications in the fabrication of semiconductor integrated circuits, micro-machines, and micro electromechanical systems (MEMS) devices. In order to pattern a thin film to the smallest photolithographic feature dimensions possible (e.g., critical dimensions) hard mask processes are typically used because photoresist mass can erode during the etching of the film and thereby create a profile in the film different than desired. A conventional hard mask patterning process is illustrated in FIGS. 1A-1D. First, a film to be patterned 104 is formed on a substrate 102. A hard mask layer 106 is then formed on the film to be patterned 104. A photoresist film is then formed on the hard mask material 106 and patterned into photoresist mask 108 having the feature patterned desired to be transferred into the thin film. A photoresist mask 108 is then formed on the hard mask layer 106. Next, as shown in FIG. 1B, the hard mask layer 106 is etched in alignment with the photoresist mask 108 to form a hard mask 110. Next, as shown in FIG. 1C, the photoresist layer can be removed and the film 104 etched in alignment with the hard mask 110 to form a patterned feature 112. Patterned feature 112, therefore, has the pattern originally formed in photoresist layer 108 and then transferred into hard mask 110. Next, as show in FIG. 1D, the hard mask 110 is removed from the patterned feature 112. The result is a patterned feature 112 formed in the film 104 having a feature shape and structure similar to that formed in photoresist layer 108. Unfortunately, the process used to removed the hard mask 110 can cause etching or pitting of the sidewalls of the structure 112 thereby altering the shape of the desired patterned feature.

DETAILED DESCRIPTION OF THE PRESENT INVENTION

A method of patterning a thin film is described. In the following description numerous specific details are set forth in order to provide a thorough understanding of the present invention. In other instances, well know semiconductor processing techniques and features have not been described in particular detail in order to not unnecessarily obscure the present invention.

Embodiments of the present invention describe methods of patterning a thin film with high degree of fidelity to a photoresist mask. According to embodiments of the present invention, a masking material is formed above the film to be patterned. The masking material is then patterned into a hard mask utilizing well known photolithography and etching techniques. Next, the thin film is etched in alignment with the hard mask. After patterning the thin film and prior to removing the hard mask, the exposed sidewalls of the film are passivated with a thin protective layer. Next, the hard mask is removed. The protective layer on the sidewalls of the patterned thin film protects the sidewalls from etching or pitting during the hard mask removal process. After removing the hard mask and any post etch residuals, the protective passivation layer on the sidewalls of the patterned film is removed. By utilizing the hard mask and a passivation protection of the sidewalls during the hard mask removal, a thin film can be patterned which has a high degree of fidelity with respect to the patterned formed in the photoresist masking material. This can be an extremely important in applications where the patterned thin film is used as a semiconductor body or fin of a nonplanar transistor where the electrical characteristics and performance of the transistor are controlled by the shape and size of the patterned semiconductor body.

Figure 2A:
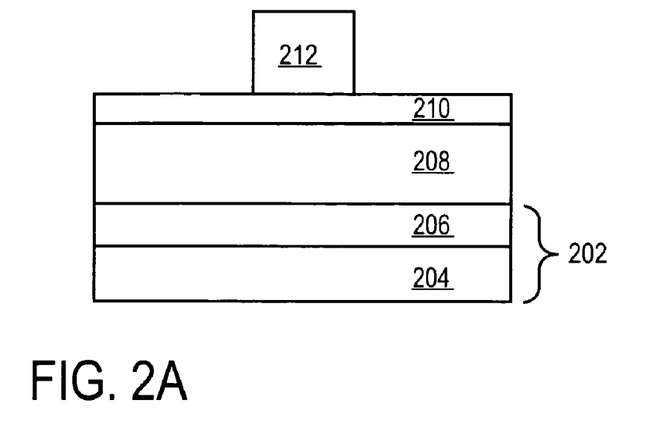
FIG. 2A-2G illustrate a method of patterning a thin film in accordance with an embodiment of the present invention.

An example of a method of patterning a thin film in accordance with embodiments of the present invention is illustrated in FIGS. 2A-2H. The process begins by forming a masking layer 210 on a film 208 to be patterned as shown in FIG. 2A. In an embodiment of the present invention, the film to be patterned 208 is formed on a substrate 202. In an embodiment of the present invention, the film 208 is a crystalline semiconductor film, such as but not limited to silicon, germanium, silicon-germanium alloys, gallium arsenide, InSb, GaP, GaSb, as well as carbon nanotubes. In an embodiment of the present invention, film 208 is an undoped or intrinsic semiconductor film. In an embodiment of the present invention, the thin film 208 is a semiconductor film doped to a p type conductivity when n type transistors are desired and doped to a n type conductivity when p type transistors are desired. In an embodiment of the present invention, thin film 208 is a silicon film doped to a p type or n type conductivity with a concentration level between $1\times10^{16}$-$1\times10^{19}$ atoms/$cm^3$. In an embodiment of the present invention, the film 208 is a semiconductor film formed to a thickness which is approximately equal to the height desired for a subsequently formed semiconductor body or bodies of a fabricated nonplanar transistor. In an embodiment of the present invention, the semiconductor film 208 is formed to a thickness between 10 and 50 nanometers and generally about 30 nanometers. In an embodiment of the present invention, substrate 202 is an insulating substrate. In an embodiment of the present invention, insulating substrate 202 includes a lower monocrystalline silicon substrate 204 and a top insulating layer 206, such as silicon dioxide film or silicon nitride film. In embodiments of the present invention, insulating layer 206 is used to isolate a semiconductor film 208 from monocrystalline silicon substrate 204. In an embodiment of the present invention, the insulating layer is formed to a thickness between 200-2000 Å. Insulating layer 206 is sometimes referred to as "a buried oxide" layer. When a silicon or semiconductor film 208 is formed on an insulating substrate 202, a silicon or semiconductor on insulator (SOI) substrate is created. For the purposes of the present invention, the substrate 202 can be considered the outer most layer or level (including all lower or previously formed layer) upon which the film 208 to be patterned is formed.

Hard mask material 210 is a material which can provide a hard mask for the etching of thin film 210. A hard mask material is a material which can retain its profile during the etching of thin film 208. Hard mask material 210 is a material which will not etch or only slightly etch during the etching of the thin film 208. In an embodiment of the present invention, the hard mask material is formed of a material such that the etchant used to etch thin film 208 will etch thin film 208 at least 5 times faster than the hard mask material and ideally at least 10 times faster. That is, in an embodiment of the present invention, the thin film 208 and the hard mask material 210 are chosen to provide an etch selectivity of at least 5:1 and ideally at least 10:1. In an embodiment of the present invention, when thin film 208 is a silicon film, hard mask materials 210 can be a silicon nitride or silicon oxynitride film. Hard mask material 210 is formed to a thickness sufficient to retain its profile during the entire etch of thin film 208 but is not to thick to cause difficulty in its patterning. In an embodiment of the present invention, hard mask material 210 is formed to a thickness between 3 nanometer to 20 nanometers and ideally to a thickness less than 10 nanometers.

Next, as also shown in FIG. 2A, a photoresist mask 212 is formed on hard mask layer 210. Photoresist mask 212 contains a feature pattern to be transferred into thin film 208. Photoresist mask 212 can be formed by any well known technique, such as by blanket depositing photoresist material and then masking, exposing, and developing the photoresist film into a photoresist mask 212 having a desired pattern for the thin film 208 to be patterned. Photoresist mask 212 is typically formed of a organic compound. Photoresist mask 212 is formed to a thickness sufficient to retain its profile while patterning hard mask film 210, but yet is not formed too thick to prevent its lithographic patterning into the smallest dimension (i.e., critical dimension) possible with the photolithography system and process used.

Figure 2B:
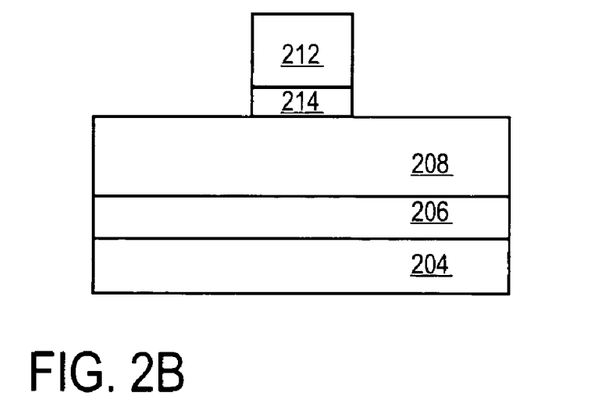

Next, as shown in FIG. 2B, hard mask material 210 is etched in alignment with photoresist mask 212 to form a hard mask 214 as shown in FIG. 2B. Photoresist mask 212 prevents the underlying portion of hard mask material 210 from becoming etched. In an embodiment of the present invention, the hard mask is etched with an etchant which can etch the hard mask material but does not etch the underlying thin film 208. The hard mask material is etched with an etchant that has almost perfect selectivity of the underlying thin film 208. That is, in an embodiment of the present invention, hard mask etchant etches the hard mask material at least 100 times faster than the underlying thin film 208 (i.e., etchant has an hard mask to thin film selectivity of at least 100:1). When hard mask material 214 is a silicon nitride or silicon oxynitride film, hard mask material 210 can be etched into a hard mask 214 utilizing a dry etch process, such as reactive ion etching. In an embodiment of the present invention, a silicon nitride or silicon oxynitride hard mask is reactive ion etched utilizing a chemistry comprising $CHF_3$ and $O_2$ and Ar.

Figure 2C:
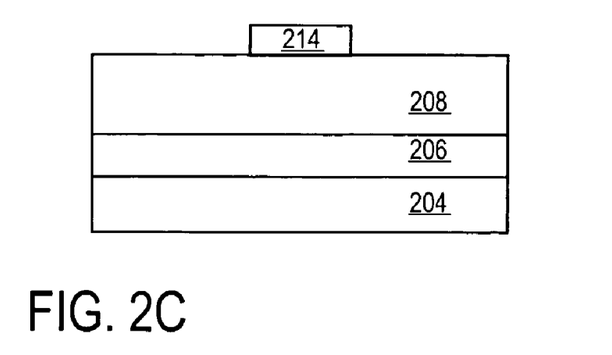

Next, as shown in FIG. 2C, after hard mask film 210 has been patterned into a hard mask 214, photoresist mask 212 can be removed by well known techniques. For example, photoresist mask 212 can be removed, for example, utilizing a "piranha" clean solution which includes sulfuric acid and hydrogen peroxide. Additionally, residue from the photoresist mask 212 can be removed with an $O_2$ ashing.

Although not required, it is desirable to remove photoresist mask 212 prior to patterning thin film 208 so that polymer film from the photoresist does not form on the sidewall of the patterned thin film 208. For example, when thin film 208 is a semiconductor thin film to be used as semiconductor body or fin in a nonplanar device, it is desirable to first remove the photoresist mask prior to etching the semiconductor thin film because dry etching processes can erode the photoresist mask and cause a polymer film to develop on the sidewalls of the semiconductor body which can be hard to remove and which can detrimentally effect device performance. By first removing the photoresist film prior to patterning a semiconductor thin film, the semiconductor thin film can be patterned and pristine sidewalls maintained.

Figure 2D:
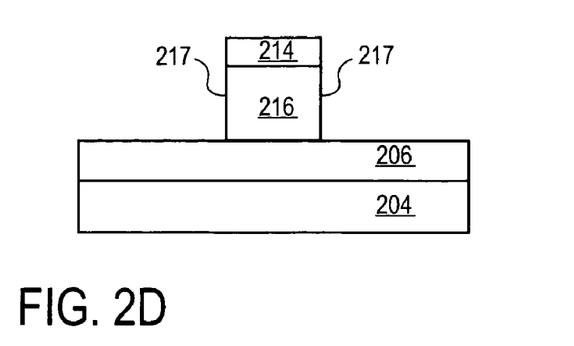

Next, as shown in FIG. 2D, film 208 is etched in alignment with hard mask 214 to form a patterned film 216 having a pair of laterally opposite sidewalls 217. Hard mask 214 prevents the underlying portion of film 208 from becoming etched during the etch process. The etch is continued until the underlying substrate or layer is reached. Film 208 is etched with an etchant which etches film 208 without significantly etching hard mask 216. In an embodiment of the present invention, film 208 is etched with an etchant which enables film 208 to be etched at least 5 times and ideally 10 times faster than hard mask 214 (i.e., etchant has an film 208 to the hard mask 214 etch selectivity of at least 5:1 and ideally at least 10:1). The thin film 208 can be etched utilizing any suitable processes. In an embodiment of the present invention, film 208 is anisotropically etched so that the patterned film 216 has nearly vertical sidewalls 217 formed in alignment with the sidewalls of hard mask 214 thereby providing an almost perfect fidelity with hard mask 214. When hard mask 214 is a silicon nitride or silicon oxynitride hard mask, and thin film 208 is a silicon film, silicon film 208 can be etched utilizing a dry etch process, such as a reactive ion etch (RIE) or a plasma etch with a chemistry comprising $Cl_2$ and HBr.

Utilizing a hard mask 214 which does not significantly etch while etching film 208 enables the profile in the hard mask to remain during the entire etch of film 208 insuring that the profile in hard mask 214 is perfectly transferred into patterned film 216. Generally, when a photoresist mask is used alone, the etchant can cause a breakdown or erosion of the photoresist mask altering the photoresist mask shape and therefore the shape of the patterned feature 216 transferred into film 208. Additionally, by removing the photoresist mask prior to etching film 208, no polymer residue is developed on the sidewalls 217 of the patterned film 216 thereby leaving pristine sidewalls 217.

Figure 2E:
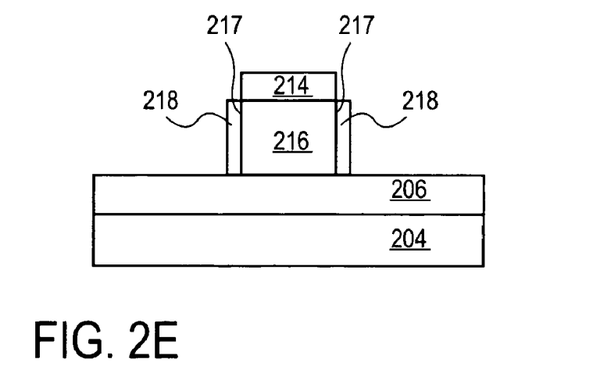

Next, as shown in FIG. 2E, a protective layer 218 is formed onto the sidewalls 217 of the patterned film 216. The protective layer 218 is formed of a material and to a thickness sufficient to protect the sidewalls 217 from the etchant used to remove hard mask 214. As such, the protective layer is formed of a material which will not be significantly etched by the etchant which is used to remove the hard mask 214. In an embodiment of the present invention, the protective layer 218 is formed to a thickness sufficient to protect the sidewalls of the patterned film 216 while removing hard mask 214. In an embodiment of the present invention, the protective layer 218 is formed of a material whereby an etchant can etch the hard mask 214 at least one hundred times faster than the material used to form the sidewall protective layer (i.e., the hard mask etchant has a hard mask to protective layer selectivity of at least 100:1).

In an embodiment of the present invention, when the hard mask 214 is a silicon nitride or silicon oxynitride film the sidewall protective layer 218 is an oxide layer, such as a silicon dioxide layer. In an embodiment of the present invention, the sidewall protective layer 218 is a passivating layer grown on the sidewalls of a crystalline silicon film. In an embodiment of the present invention, the protective layer 218 is a silicon dioxide film grown on the sidewalls of a silicon film 216 utilizing a wet chemical treatment with an aqueous solution comprising hydrogen peroxide or an organic peroxide. In an embodiment of the present invention, a silicon dioxide passivating film 218 is grown on the sidewalls of a silicon film 216 utilizing between 3-12% (by volume) of unstablized (i.e., no organic stabilizers) hydrogen peroxide and DI water. In an embodiment of the present invention, the hydrogen peroxide solution is heated to a temperature between 35-50° C. and ideally to 40° C. while growing the silicon dioxide film 218. Megasonic energy between 0.75 to 1.25 megahertz can be applied to the chemical solution while the wafer is immersed in a chemical bath to grow the film. The megasonic energy helps release the O diradical from the hydrogen peroxide. In an embodiment of the present invention, a thin protective layer between about 5-7 Å or about two monolayer of silicon dioxide is formed on the sidewall 217. The advantage of the chemical solution described above, is that such a process grows silicon dioxide film in a self limiting manner. That is, the chemical treatment described above grows a silicon dioxide film to approximately two monolayers and then the growth stops thereby providing a very thin film of uniform thickness. In this way, the thickness of the film is not tine dependent providing a manufacturable and reliable growth method. In an embodiment of the present invention, the substrate is immersed in the hydrogen peroxide solution for at least five minutes. If a slightly thicker (e.g., 3 monolayers) silicon dioxide protective layer is desired the temperature of the solution can be increased. Additionally another advantage of the present chemical process used to grow a silicon dioxide film, is that it is not dopant dependent. That is, the silicon dioxide film grows to the same thickness on the sidewalls no matter how much dopant is included on that portion of the sidewall. Additionally, the aqueous solution provides a growth rate and self limiting thickness which is independent of the crystal plane of the patterned silicon film. In this way, a very thin and uniform protective layer 218 can be formed in a reliable and manufacturable manner.

Alternatively, other methods can be used to form the protective layer 218. For example, a plasma or thermal oxide can be grown on sidewalls 217 of a silicon film 216. For example, a remote or direct plasma process with an ambient comprising $O_2$ or $O_3$ can be utilized to form a protective layer 218.

Figure 2F:
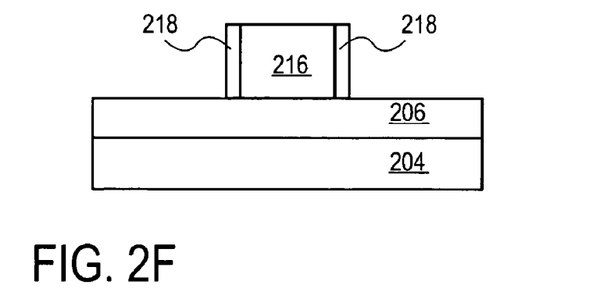

Next, hard mask 214 is removed from the top of patterned film 216 as shown in FIG. 2F. Hard mask 214 is removed with an etchant which can etch hard mask 214 without significantly etching sidewall protective layers 218. In an embodiment of the present invention, the hard mask 214 is removed with an etchant which etches the hard mask 214 at least 100 times faster than the sidewalls 218 (i.e., the etchant has a hard mask 214 to protective sidewall layer 218 selectivity of at least 100:1). In an embodiment of the present invention, when the hard mask 214 is a silicon nitride or silicon oxynitride film and the protective layer 218 is a silicon dioxide film, a wet chemistry comprising phosphoric acid and DI water can be used to remove the hard mask. In an embodiment of the present invention, a hard mask etchant comprising between 80-90% phosphoric acid (by volume) and DI water, heated to a temperature between 150-170° C. and ideally 160° C. is used. In an embodiment of the present invention, a small amount of (e.g., 100 ppm) of silicon, such as TEOS, is dissolved into the phosphoric acid solution in order to help increase its selectivity between the hard mask 214 and sidewall protective layer. Such an etchant will have an almost perfect selectivity between a silicon nitride hard mask 214 and silicon dioxide 218 protective layer. Such an etchant would typically slightly etch or pit unprotected sidewalls of a silicon film 216. However, in the present invention, the sidewalls 217 of the silicon film 216 are protected from pitting or etching by protective sidewall layer 218. Thus, in the present invention, the protective sidewall layers 218 enable the hard mask layer 214 to be removed with an etchant which can etch or pit the patterned thin film 216.

In an embodiment of the present invention, after removing the hard mask 214 the substrate can be cleaned utilizing a standard SC1 and SC2 cleans. It is desirable to clean the substrate after removal of the hard mask with phosphoric acid because phosphoric acid typically includes many metallic impurities which can effect device performance and reliability.

Figure 2G:
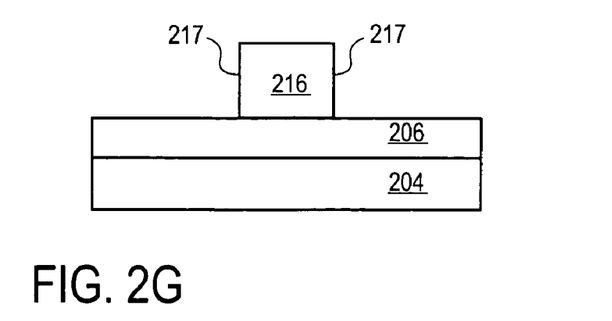

Next, after removing hard mask 214 the sidewall passivation or protective layer 218 are removed from pattern film 216. In an embodiment of the present invention, the sidewall protective layer 218 is removed with an etchant which etches the sidewall passivation layer without significantly etching the patterned film. In an embodiment of the present invention, the etch used to remove the sidewall protective layer etches the sidewall protective layer 218 at least 100 times faster than the patterned thin film (i.e., the etchant has a protective layer to the patterned film selectivity of at least 100:1). In an embodiment of the present invention, when the sidewall protective layer 218 is a silicon dioxide film and the patterned film 216 is a silicon film, the sidewall protection layer 218 can be removed with an aqueous solution comprising HF. In an embodiment of the present invention, a silicon dioxide protective layer is removed from a patterned silicon film 216 utilizing a solution comprising between 0.5-2% and ideally 1% (by volume) HF in the DI water. In an embodiment of the present invention, the HF solution is chilled to approximately 15° C. Such an etchant will provide nearly perfect selectivity between a patterned silicon body and the silicon dioxide sidewall protection layer 218.

After removal of the sidewall protection layer 218, a perfectly patterned film 216 has been formed. Because of the sidewall protection layer 218, no etch or pitting has occurred on the sidewalls during the removal of the hard mask leaving pristine sidewalls 217 nearly identical to its original form after the etch shown in FIG. 2D.

Patterning a thin film with the method of the present invention is ideal for use in forming a semiconductor body of fin for a nonplanar transistor, such as a tri-gate transistor or a FIN-FET transistor where the sidewalls of the body or fin provide a portion of the channel region of the device so that their pristine condition is important for device performance and electrical characteristics.

Figure 2H:
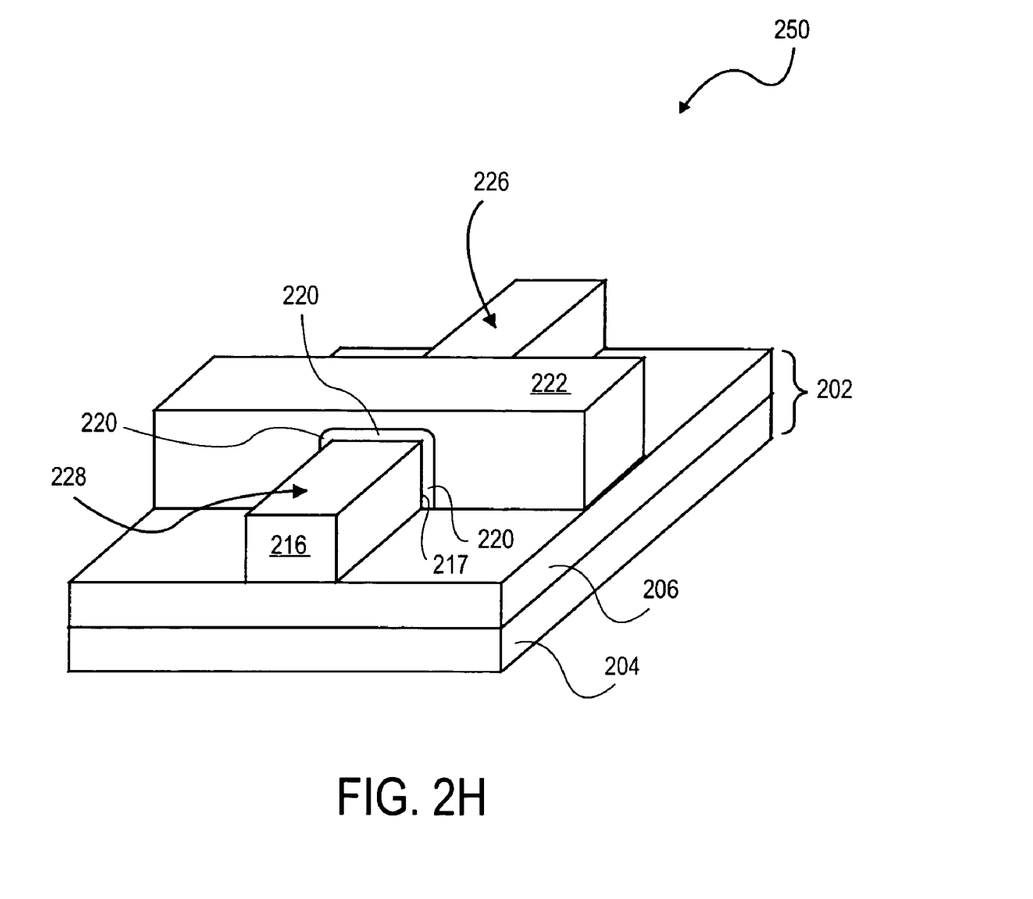
FIG. 2H illustrate a cross sectional view of a nonplanar transistor having a semiconductor body patterned in accordance with an embodiment of the present invention.

In an embodiment of the present invention, a semiconductor thin film, such as a doped single crystalline silicon film, is patterned with the method set forth in FIGS. 2A-2G to form a semiconductor body or fin 216 for a nonplanar transistor 250, such as illustrated in FIG. 2H. A nonplanar transistor has a gate dielectric layer 220, such as silicon dioxide or silicon nitride or high K dielectric, such as hafnium oxide, zirconium oxide, titanium oxide or tantalum oxide formed over the top and sidewalls 217 of the patterned crystalline semiconductor film 216. A gate electrode 222 is formed on the gate dielectric layer 220 on the top surface and sidewalls of the patterned semiconductor body 216 as shown in FIG. 2H. A source region 226 and a drain region 228 are formed in semiconductor body 216 on opposite sides of gate electrode 222 as also shown in FIG. 2H. The gate dielectric layer 220 and a gate electrode 222 can be formed by blanket depositing or growing gate dielectric layer 220 over the substrate shown in FIG. 2G and then blanket depositing gate electrode material over the gate dielectric layer. The gate dielectric layer and the gate electrode film can then patterned with well known photolithography and etching techniques to form a gate electrode 222 and a gate dielectric layer 220. Next, well know ion implantation techniques can be used to implant either n type or p type conductivity ions into the semiconductor body 216 to form the source region 226 and the drain region 228. Alternatively, the gate dielectric layer and gate electrode can be formed utilizing a well known replacement gate process. Because the sidewalls 217 of the semiconductor body 216 have been protected during the removal of the hard mask, pristine sidewalls have been preserved providing an excellent semiconductor surface for the channel region of the nonplanar device 250.

Although the present invention is ideally suited for the patterning a semiconductor thin film for a nonplanar device, the present invention is not to be limited to such an application and can find use in any number of applications. For example, the method can be used to pattern a metal film into an interconnect or an electrode. The present invention can also be used to pattern dielectric film, such as low K dielectrics, for ILDs or high K dielectrics for capacitors or transistors. The present invention can also be used to pattern films for other types of devices, such as bipolar transistors. Additionally, the present invention can be used to pattern films used in the fabrication of micro machines or MEMS devices.

Figure 3A:
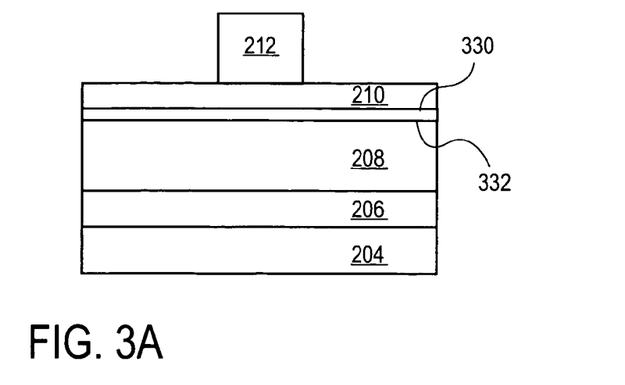
FIG. 3A-3D illustrate a method of patterning a thin film in accordance with an embodiment of the present invention.
Figure 3B:
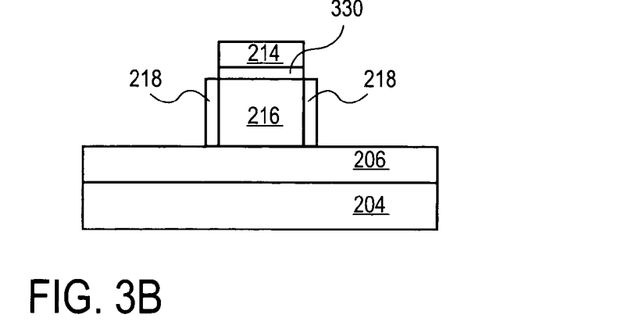

FIGS. 3A-3D illustrate a further embodiment of the present invention. When removing hard mask 214 from patterned film 216 as shown in FIGS. 2E and 2F, the etchant used to remove the hard mask can cause pitting or etching of the top surfaced of the patterned film 216. In an embodiment of the present invention, as shown in FIG. 3A, a protective layer 330 can be formed on the top surface of the film 208 to be patterned in order to preserve and protect the pristine top surface. The hard mask material 210 is then formed directly on top of the protective layer 330 formed on the top surface 332 of the film to be patterned. In an embodiment of the present invention, the top protective layer 330 is formed of the same material used to form the sidewall protection layer 218. In an embodiment of the present invention, the top protective layer 330 is formed in the same manner and to the same thickness as the sidewall protective layer 218, such as described with respect to FIG. 2E. In an embodiment of the present invention, when the film 208 to be patterned is a silicon film, the top protective layer is a silicon dioxide film formed by a chemical treatment as described above. After forming the protective layer 330 and hard mask material 210, the protective layer and hard mask are patterned as shown in FIG. 3B. The photoresist mask 212 can then be removed and the film 208 patterned in alignment with the hard mask 214 into a patterned film 216 having a pair of sidewalls as shown in FIG. 3B. Next, as also shown in FIG. 3B, the sidewall protective layers 218 are formed on the sidewalls of the patterned film 216 in a manner such as described with respect FIG. 2E.

Figure 3C:
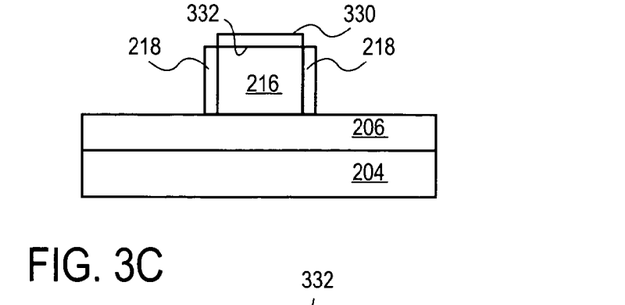

Next, as shown in FIG. 3C, the hard mask 214 is removed as described in with respect to FIG. 2F. The top protective layer 330 protects the top surface 332 of the patterned film 216 while removing the hard mask 214.

Figure 3D:
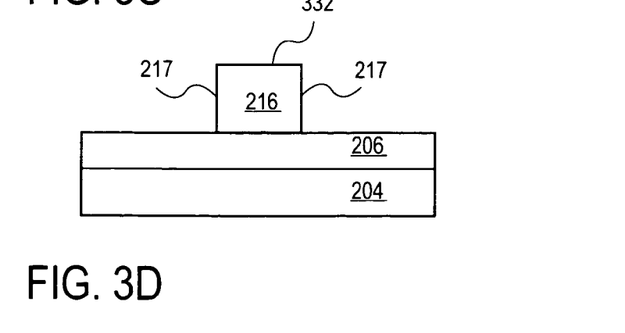

Next, as shown in FIG. 3D, the top protective layer 330 and the sidewall protective layer 218 are removed. In an embodiment of the present invention, the sidewall protective layer 218 and the top protective layer 330 are removed simultaneously. The sidewall protective layer 218 and the top protective layer 330 can be removed as described with respect to FIG. 2G. After removal of the top protective layer and sidewall protective layers 218, a patterned film 216 is formed having unetched and unpitted pristine sidewalls 217 and an unetched and unpitted pristine top surface 332.

Thus, a method of patterning a thin film has been described.

We claim:

1. A method of patterning a film comprising:
forming a hard mask above a film to be patterned;
etching said film in alignment with said hard mask to form a patterned film having a pair of laterally opposite sidewalls;
forming a protective layer on said pair of laterally opposite sidewalls;
after forming said protective layer, removing said hard mask from above said patterned film; and
after removing said hard mask from said patterned film, removing said protective layer from said sidewalls.

2. The method of claim 1 further comprising prior to forming said hard mask on said film to be patterned, forming a protective layer on the top surface of said film to be patterned.

3. The method of claim 1 wherein said film is a semiconductor film.

4. A method of patterning a film comprising:
forming a mask above a monocrystalline silicon film to be patterned;
etching said monocrystalline silicon film in alignment with said mask to form a patterned monocrystalline silicon film having a pair of laterally opposite sidewalls;
forming a protective layer on said pair of laterally opposite sidewalls;
after forming said protective layer, removing said mask from above said patterned monocrystalline silicon film; and
after removing said mask from said patterned monocrystalline silicon film, removing said protective layer from said sidewalk.

5. The method of claim 4 wherein said mask is a silicon nitride film.

6. The method of claim 5 wherein said protective layer on said sidewalls is a silicon dioxide film.

7. The method of claim 6 wherein said protective layer is formed by exposing said monocrystalline silicon film to a solution comprising hydrogen peroxide.

8. The method of claim 6 wherein said mask is removed with a wet etchant comprising phosphoric acid and water.

9. A method of patterning a semiconductor film comprising:
forming a masking layer above a semiconductor film formed on a substrate;
patterning said masking layer into a mask;
etching said semiconductor film in alignment with said mask to form a semiconductor body having a pair of laterally opposite sidewalls;
forming a protective layer on said sidewalls of said semiconductor body;
after forming said protective layer, removing said mask from above said semiconductor body;
after removing said mask from said semiconductor body, removing said protective layer on said sidewalls of said semiconductor body; and
wherein said mask is a silicon nitride or silicon oxynitride film and wherein said mask is removed utilizing a wet etchant comprising phosphoric acid and DI water.

10. A method of patterning a semiconductor film comprising:
forming a masking layer above a semiconductor film formed on a substrate;
patterning said masking layer into a mask;
etching said semiconductor film in alignment with said mask to form a semiconductor body having a pair of laterally opposite sidewalls;
forming a protective layer on Said sidewalls of said semiconductor body;
after forming said protective layer, removing said mask from above said semiconductor body;
after removing said mask from said semiconductor body, removing said protective layer on said sidewalls of said semiconductor body; and
wherein said semiconductor film is a doped single crystalline silicon film.

11. The method of claim 10 wherein said protective layer on said sidewalls is a silicon dioxide film.

12. The method of claim 11 wherein said silicon dioxide film is grown by exposing said doped single crystalline silicon film to an aqueous solution comprising a peroxide.

13. The method of claim 12 wherein said silicon dioxide film grown by exposing said sidewalls to an ageous solution comprising between 3-12% by volume of unstabilized hydrogen peroxide.

14. The method of claim 11 wherein said silicon dioxide is formed by exposing said doped single crystalline film to ozone.

15. A method of patterning a semiconductor film comprising:
forming a masking layer above a semiconductor film formed on a substrate;
patterning said masking layer into a mask;

etching said semiconductor film in alignment with said mask to form a semiconductor body having a pair of laterally opposite sidewalls;

forming a protective layer on said sidewalls of said semiconductor body;

after forming said protective layer, removing said mask from above said semiconductor body;

after removing said mask from said semiconductor body, removing said protective layer on said sidewalk of said semiconductor body; and forming a gate dielectric layer on said sidewalls of said semiconductor body and forming a gate electrode over and around said semiconductor body and adjacent to said gate dielectric layer on said sidewalls of said semiconductor body.

16. A method of forming a nonplanar transistor comprising:

doping a single crystalline silicon film formed on a substrate;

forming a silicon nitride layer over said doped single crystalline silicon film;

patterning said silicon nitride layer into a silicon nitride hard mask;

etching said doped single crystalline silicon film in alignment with said silicon nitride hard mask to define a doped single crystalline silicon body having a pair of laterally opposite sidewalls;

growing a silicon dioxide film on said sidewalls of said doped single crystalline silicon film;

removing said silicon nitride hard mask from above said doped single crystalline silicon body;

after removing said silicon nitride hard mask, removing said silicon dioxide film from said sidewalls of said doped single crystalline silicon body;

forming a gate dielectric layer on said pair of laterally opposite sidewalls and on the top surface of said doped single crystalline silicon body;

forming a gate electrode on said gate dielectric layer on said top surface of said doped single crystalline silicon body and adjacent to said gate dielectric layer on said sidewalls of said doped single crystalline silicon body; and forming a pair of source/drain regions in said single crystalline silicon body on opposite sides of said gate electrode.

17. The method of claim 16 wherein said silicon dioxide film is grown by exposing said sidewalls to an aqueous solution comprising a peroxide.

18. The method of claim 17 wherein said peroxide is hydrogen peroxide.

19. The method of claim 18 wherein sonic energy is applied to said hydrogen peroxide while growing said silicon dioxide film.

20. The method of claim 16 wherein said silicon oxide film is approximately two mono-layers thick.

21. The method of claim 16 wherein said oxide is grown by exposing said sidewalls to a plasma or thermal oxidation process.

22. The method of claim 16 wherein said silicon nitride hard mask is removed utilizing a wet etchant comprising phosphoric acid and DI water.

23. The method of claim 22 wherein said wet etchant is heated to a temperature between 150-170° C.

24. The method of claim 16 wherein said silicon dioxide film on said sidewalls is removed utilizing an aqueous solution comprising HF.

25. The method of claim 24 wherein said aqueous solution comprises between 0.5 to 2% HF and wherein said aqueous solution is less than room temperature.

26. The method of claim 16 wherein prior to forming said masking layer above said doped single crystalline silicon film, a silicon dioxide film is grown on said doped single crystalline silicon film and wherein said hard mask is formed on said silicon dioxide film grown on said doped single crystalline silicon film.

27. The method of claim 26 wherein removing said silicon dioxide film from said top surface of said doped single crystalline silicon film and removing said silicon dioxide film from said sidewalls.

28. A method of patterning a film comprising:

forming a masking material on a film to be patterned;

patterning said masking material into a mask;

etching said film with a first etchant which etches said film without significantly etching said masking material to form a patterned film having a pair of laterally opposite sidewalls;

after forming said patterned films, selectively forming a passivation layer on said sidewalls of said patterned film; and removing said mask with a second etchant which does not significantly etch said passivation layer on said sidewalls, wherein said second etchant is capable of etching said film.

29. The method of claim 28 wherein said first etchant has a etch selectivity of said masking material to said film of at least 100:1.

30. The method of claim 28 wherein said second etchant has a etch selectivity of said masking material to said sidewall passivation layer of at least 100:1.

31. A method of patterning a film comprising:

forming a masking material on a film to be patterned;

patterning said masking material into a mask utilizing a patterned photoresist film;

removing said patterned photoresist film;

etching said film with a first etchant which etches said film without significantly etching said masking material to form a patterned film having a pair of laterally opposite sidewalls;

after forming said patterned film, forming a passivation layer on said sidewalls of said patterned film; and removing said mask with a second etchant which does not significantly etch said passivation layer on said sidewalls, wherein said second etchant is capable of etching said film.

32. The method of claim 28 further comprising after removing said mask, removing said passivation layer from said sidewalk.

* * * * *

UNITED STATES PATENT AND TRADEMARK OFFICE
CERTIFICATE OF CORRECTION

PATENT NO. : 7,579,280 B2  Page 1 of 1
APPLICATION NO. : 10/859328
DATED : August 25, 2009
INVENTOR(S) : Brask et al.

It is certified that error appears in the above-identified patent and that said Letters Patent is hereby corrected as shown below:

In column 9, at line 9 delete, "sidewalk" and insert --sidewall--.

In column 10, at line 59 delete, "sidewalk" and insert --sidewall--.

Signed and Sealed this

Eighth Day of June, 2010

David J. Kappos
*Director of the United States Patent and Trademark Office*

UNITED STATES PATENT AND TRADEMARK OFFICE
CERTIFICATE OF CORRECTION

PATENT NO. : 7,579,280 B2  Page 1 of 1
APPLICATION NO. : 10/859328
DATED : August 25, 2009
INVENTOR(S) : Brask et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 534 days.

Signed and Sealed this

Fourteenth Day of September, 2010

David J. Kappos
*Director of the United States Patent and Trademark Office*